(12) United States Patent
Yamada et al.

(10) Patent No.: US 9,209,379 B2
(45) Date of Patent: Dec. 8, 2015

(54) PIEZOELECTRIC VIBRATION ELEMENT AND PIEZOELECTRIC DEVICE

(71) Applicant: NIHON DEMPA KOGYO CO., LTD., Tokyo (JP)

(72) Inventors: Hiroaki Yamada, Saitama (JP); Takashi Yamaguchi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 158 days.

(21) Appl. No.: 13/761,178

(22) Filed: Feb. 7, 2013

(65) Prior Publication Data

US 2013/0214648 A1 Aug. 22, 2013

(30) Foreign Application Priority Data

Feb. 20, 2012 (JP) ................. 2012-033516

(51) Int. Cl.
| | |
|---|---|
| *H03H 9/19* | (2006.01) |
| *H01L 41/047* | (2006.01) |
| *H03H 9/10* | (2006.01) |
| *H03H 9/13* | (2006.01) |
| *H03H 9/02* | (2006.01) |

(52) U.S. Cl.
CPC ......... *H01L 41/047* (2013.01); *H03H 9/02157* (2013.01); *H03H 9/1014* (2013.01); *H03H 9/1021* (2013.01); *H03H 9/13* (2013.01); *H03H 9/19* (2013.01)

(58) Field of Classification Search
CPC . H03H 9/02157; H03H 9/02007; H03H 9/10; H03H 9/1007; H03H 9/1014; H01L 41/047; H01L 41/053
USPC .......................................... 310/340, 344, 348
See application file for complete search history.

(56) References Cited

U.S. PATENT DOCUMENTS

2007/0096596 A1* 5/2007 Naito et al. .................... 310/320
2012/0126668 A1* 5/2012 Ii et al. .......................... 310/357

FOREIGN PATENT DOCUMENTS

JP 2005-094410 4/2005

* cited by examiner

*Primary Examiner* — Derek Rosenau
(74) *Attorney, Agent, or Firm* — Jianq Chyun IP Office

(57) ABSTRACT

A piezoelectric vibration element includes a piezoelectric piece, a pair of excitation electrodes, and a pair of extraction electrodes. The piezoelectric piece has a rectangular shape with long sides and short sides and a first principal surface and a second principal surface. The piezoelectric piece includes a mesa portion thicker than a peripheral portion at least on the first principal surface. The excitation electrode is larger than an area of the mesa portion and covers the mesa portion on the principal surface where the mesa portion is formed. The excitation electrode has a center away from a center of the piezoelectric piece toward another short side by a first distance. The mesa portion has a center away from the center of the piezoelectric piece to the other short side by a second distance. The second distance is different from the first distance.

7 Claims, 13 Drawing Sheets

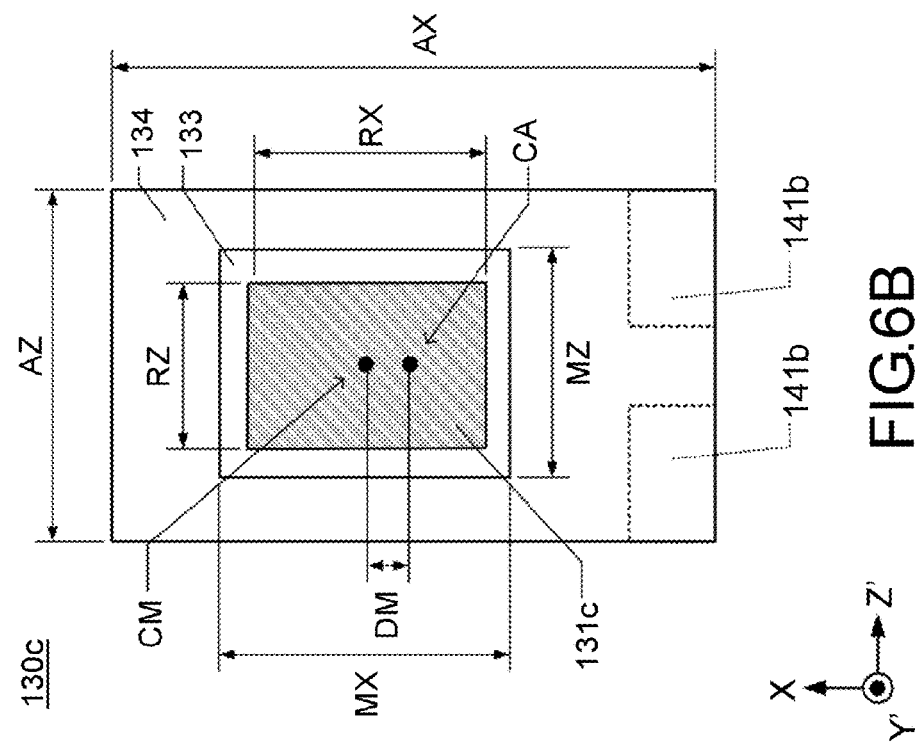
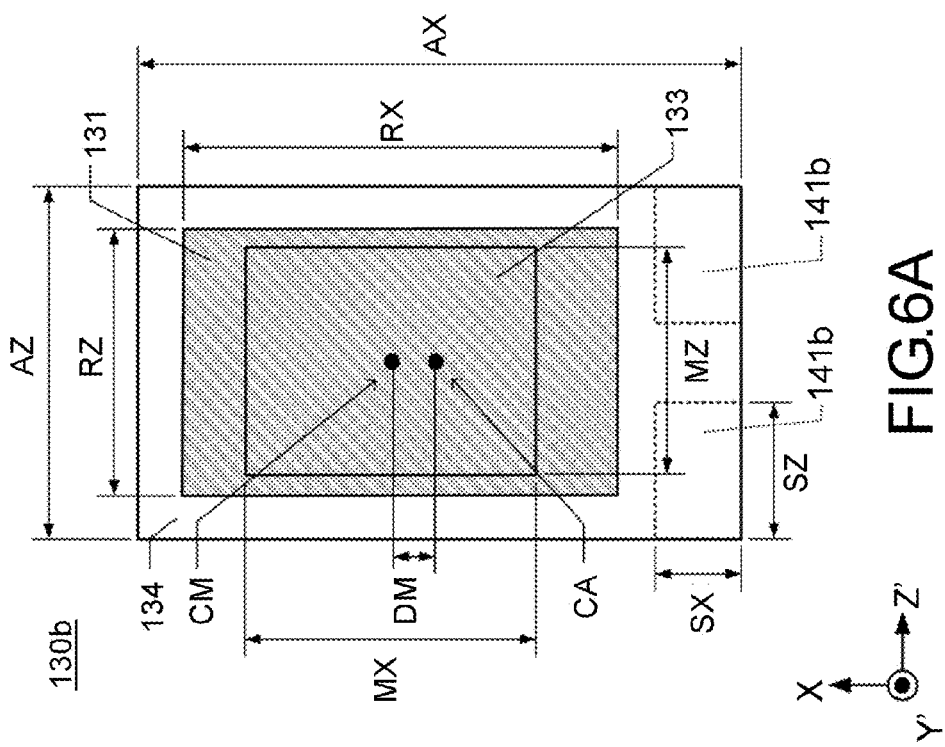

| Piezoelectric vibration element | Dimensions of excitation electrode | | | Dimensions of mesa portion | |
|---|---|---|---|---|---|
| | RX | RZ | DR | MX | MZ |
| 130d | 0.89 | 0.64 | 0.0 | 0.4 | 0.6 |
| 130e | 0.89 | 0.64 | 0.045 | 0.4 | 0.6 |
| 130f | 1.1 | 0.64 | 0.1 | 0.6 | 0.6 |
| 130g | 1.1 | 0.64 | 0.1 | 0.8 | 0.6 |

FIG.8

PIEZOELECTRIC VIBRATION ELEMENT AND PIEZOELECTRIC DEVICE

CROSS-REFERENCE TO RELATED APPLICATIONS

This application claims the priority benefit of Japan application serial no. 2012-033516, filed on Feb. 20, 2012. The entirety of the above-mentioned patent application is hereby incorporated by reference herein and made a part of this specification.

TECHNICAL FIELD

This disclosure relates to a piezoelectric vibration element and a piezoelectric device that include a mesa-type piezoelectric piece with improved vibration characteristic where a frequency variation is less generated by impact such as a drop and a temperature change.

DESCRIPTION OF THE RELATED ART

A piezoelectric piece that includes an excitation electrode and vibrates at a predetermined vibration frequency by applying a voltage to the excitation electrode and a piezoelectric vibration element including this piezoelectric piece are known. Placing this piezoelectric vibration element on a package forms a piezoelectric device. The piezoelectric piece includes a mesa portion, which is thicker than a peripheral portion of the piezoelectric piece, on the principal surface. This structure is known to improve a crystal impedance (CI) value. Further, in the piezoelectric vibration element and the piezoelectric device that include a mesa-type piezoelectric piece where this mesa portion is formed, it is known that a vibration characteristic changes by formation positions, sizes, and other conditions of the mesa portion and an electrode.

For example, Japanese Unexamined Patent Application Publication No. 2005-94410 discloses a mesa-type vibrating piece where an excitation electrode is formed larger than a mesa portion. This increases a frequency variable sensitivity and suppresses an unnecessary vibration. Additionally, this prevents an electrical short-circuit between a conductive adhesive and the excitation electrode by forming the mesa portion away from the conductive adhesive.

However, in the piezoelectric vibration element and the piezoelectric device, a frequency variation may be generated by stress applied to the piezoelectric piece by impact, such as a drop and a temperature change or similar causes. A countermeasure against this problem is required. A vibration characteristic is also required to be further improved.

A need thus exists for a piezoelectric vibration element and a piezoelectric device which are not susceptible to the drawback mentioned above.

SUMMARY

A piezoelectric vibration element according to a first aspect includes a piezoelectric piece, a pair of excitation electrodes on the first principal surface and the second principal surface, and a pair of extraction electrodes extracted from the pair of excitation electrodes to one of the short sides. The piezoelectric piece has a rectangular shape with long sides and short sides. The piezoelectric piece includes a first principal surface and a second principal surface. The second principal surface is a backside surface of the first principal surface. The piezoelectric piece includes a mesa portion at least on the first principal surface. The mesa portion is thicker than a peripheral portion. The excitation electrode is larger than an area of the mesa portion and covers the mesa portion on the principal surface where the mesa portion is formed. The excitation electrode has a center away from a center of the piezoelectric piece toward another short side by a first distance. The mesa portion has a center away from the center of the piezoelectric piece to the other short side by a second distance. The second distance is different from the first distance.

BRIEF DESCRIPTION OF THE DRAWINGS

The foregoing and additional features and characteristics of this disclosure will become more apparent from the following detailed description considered with the reference to the accompanying drawings, wherein:

FIG. 4A is a plan view of a piezoelectric vibration element 130a;

FIG. 4B is a plan view of the piezoelectric vibration element 130a where a simulation result of stress distribution at a drop of the piezoelectric device is illustrated;

FIG. 4C is a plan view of the piezoelectric vibration element 130a where a simulation result of stress distribution at a temperature change of the piezoelectric device is illustrated;

FIG. 6A is a plan view of a piezoelectric vibration element 130b;

FIG. 6B is a plan view of the piezoelectric vibration element 130c;

FIG. 8 is a table listing dimensions of an excitation electrode and dimensions of the mesa portion of the piezoelectric vibration element;

FIG. 13A is a plan view of a piezoelectric vibration element 230a;

DETAILED DESCRIPTION

The preferred embodiments of this disclosure will be described with reference to the attached drawings. It will be understood that the scope of the disclosure is not limited to the described embodiments, unless otherwise stated.

Constitution of a Piezoelectric Device 100 of a First Embodiment

Figure 1:
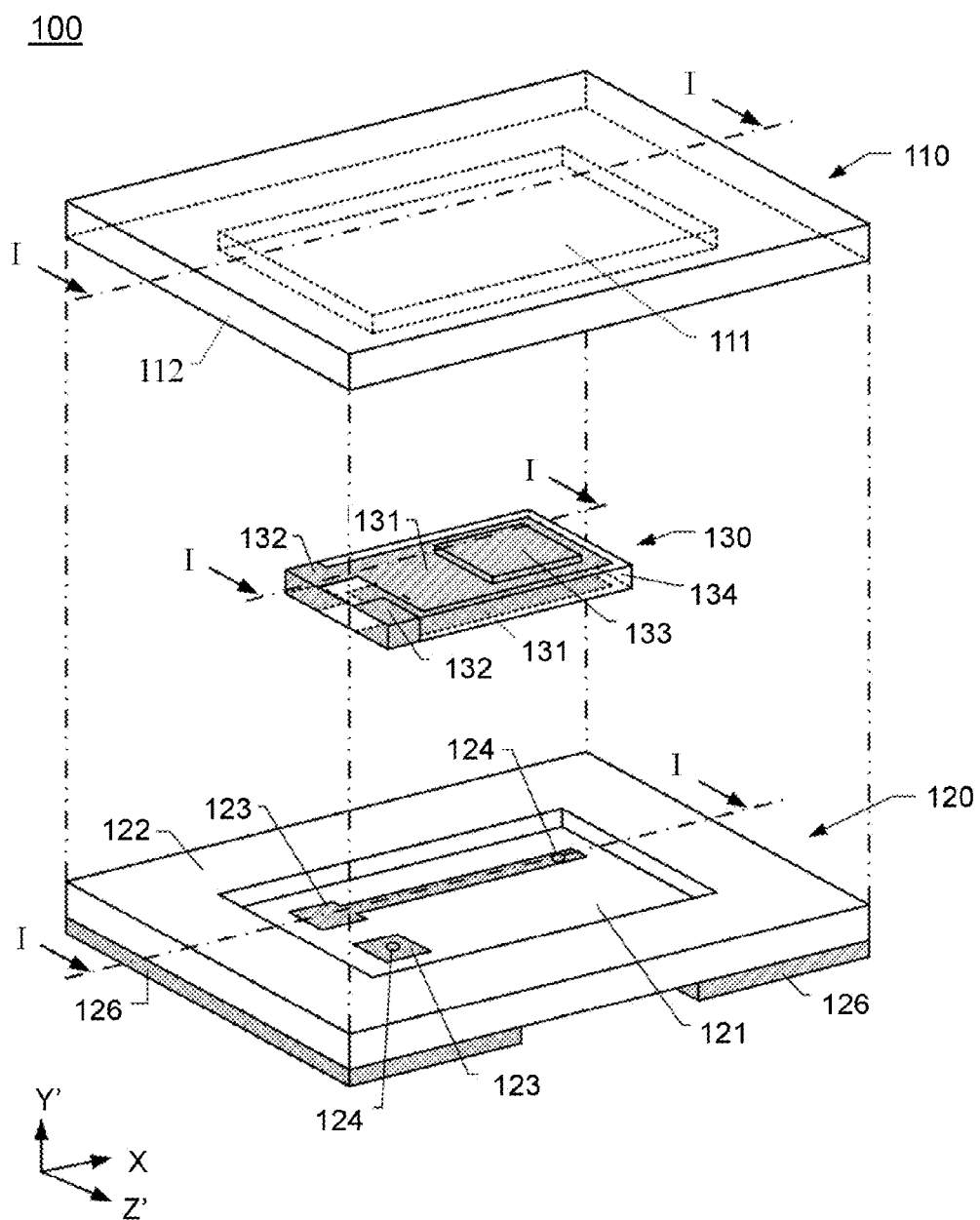
FIG. 1 is an exploded perspective view of a piezoelectric device 100.

FIG. 1 is an exploded perspective view of a piezoelectric device 100. The piezoelectric device 100 includes a lid plate 110, a base plate 120, and a piezoelectric vibration element 130. The piezoelectric vibration element 130 employs, for example, an AT-cut crystal resonator. The AT-cut crystal resonator has a principal surface (in the Y-Z plane) that is tilted by 35° 15' about the Y-axis of crystallographic axes (XYZ) in the direction from the Z-axis to the Y-axis around the X-axis. In the following description, the new axes tilted with reference to the axis directions of the AT-cut crystal resonator are denoted as the Y'-axis and the Z'-axis. This disclosure defines the long side direction of the piezoelectric device 100 as the X-axis direction, the height direction of the piezoelectric device 100 as the Y'-axis direction, and the direction perpendicular to the X and Y'-axis directions as the Z'-axis direction.

The piezoelectric vibration element 130 includes a piezoelectric piece 134 with a mesa portion 133, an excitation electrode 131, and an extraction electrode 132. The piezoelectric piece 134 vibrates at a predetermined frequency and has a rectangular shape. The protruded mesa portions 133 are formed on the principal surfaces of the piezoelectric piece 134 at the +Y'-axis side and the −Y'-axis side. The excitation electrode 131 is formed on the whole area and at the peripheral area of the mesa portion 133. The extraction electrode 132 is extracted from each excitation electrode 131 to the −X-axis side. The extraction electrode 132 is extracted from the excitation electrode 131, which is formed on the surface at the +Y'-axis side of the piezoelectric piece 134, and the extraction electrode 132 is extracted from the excitation electrode 131 to the −X-axis side, and is further extracted to the surface at the −Y'-axis side of the piezoelectric piece 134 via the side surface at the −Z'-axis side of the piezoelectric piece 134. The extraction electrode 132 is extracted from the excitation electrode 131, which is formed on the surface at the −Y'-axis side of the piezoelectric piece 134, and the extraction electrode 132 is extracted from the excitation electrode 131 to the −X-axis side, and is further extracted to the surface at the +Y'-axis side of the piezoelectric piece 134 via the side surface at the +Z'-axis side of the piezoelectric piece 134.

A bonding surface 122 is formed at the peripheral area of the surface at the +Y'-axis side of the base plate 120. The bonding surface 122 is to be bonded to the lid plate 110 via a sealing material 142 (see FIG. 2). The base plate 120 includes a depressed portion 121 at the center of the surface at the +Y'-axis side. The depressed portion 121 is depressed from the bonding surface 122 in the −Y'-axis direction. A pair of connecting electrodes 123 is formed in the depressed portion 121. Each connecting electrode 123 electrically connects to an extraction electrode 132 of the piezoelectric vibration element 130 via a conductive adhesive 141 (see FIG. 2). The base plate 120 includes a pair of external electrodes 126 on the surface at the −Y'-axis side. The external electrode 126 electrically connects to the connecting electrode 123 with a through electrode 124 that passes through the base plate 120.

The lid plate 110 includes a depressed portion 111 on the surface at the −Y'-axis side. The depressed portion 111 is depressed in the +Y'-axis direction. A bonding surface 112 is formed surrounding the depressed portion 111. The bonding surface 112 is bonded to the bonding surface 122 of the base plate 120 via the sealing material 142 (see FIG. 2).

Figure 2:
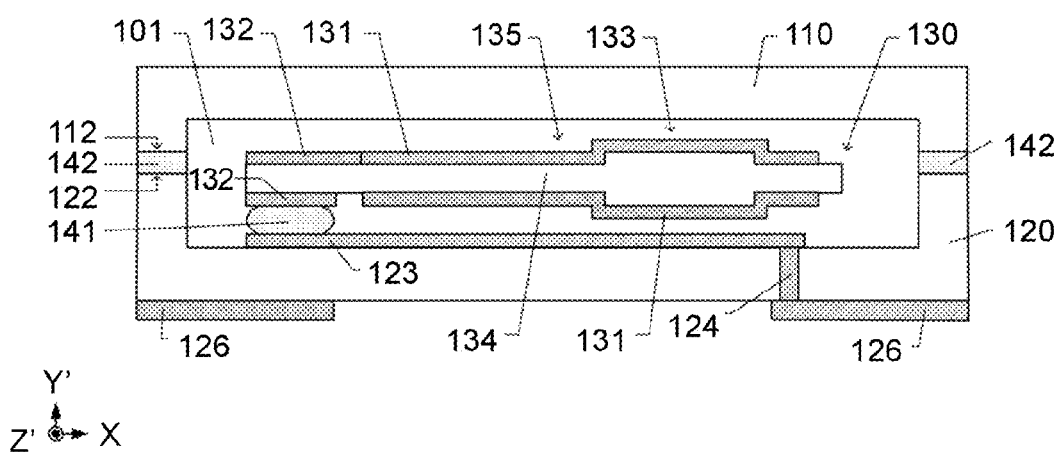
FIG. 2 is a cross-sectional view taken along the line I-I of FIG. 1.

FIG. 2 is a cross-sectional view taken along the line I-I of FIG. 1. A cavity 101 is sealed in the piezoelectric device 100. With the piezoelectric device 100, the cavity 101 is formed by bonding the bonding surface 122 of the base plate 120 and the bonding surface 112 of the lid plate 110 together via the sealing material 142. The piezoelectric vibration element 130 is disposed in the cavity 101. The piezoelectric vibration element 130 includes the excitation electrode 131. A piezoelectric piece 134 includes the mesa portion 133. The thickness of the mesa portion 133 in the Y'-axis direction is thicker than the thickness of a peripheral portion 135 that surrounds the mesa portion 133 in the Y'-axis direction. The piezoelectric vibration element 130 is formed by bonding the extraction electrode 132 and the connecting electrode 123 of the base plate 120 together via the conductive adhesive 141. The piezoelectric vibration element 130 is disposed in the cavity 101. Additionally, the extraction electrode 132 electrically connects to the connecting electrode 123 via the conductive adhesive 141. This electrically connects the excitation electrode 131 and an external electrode 126 together.

Figure 3:
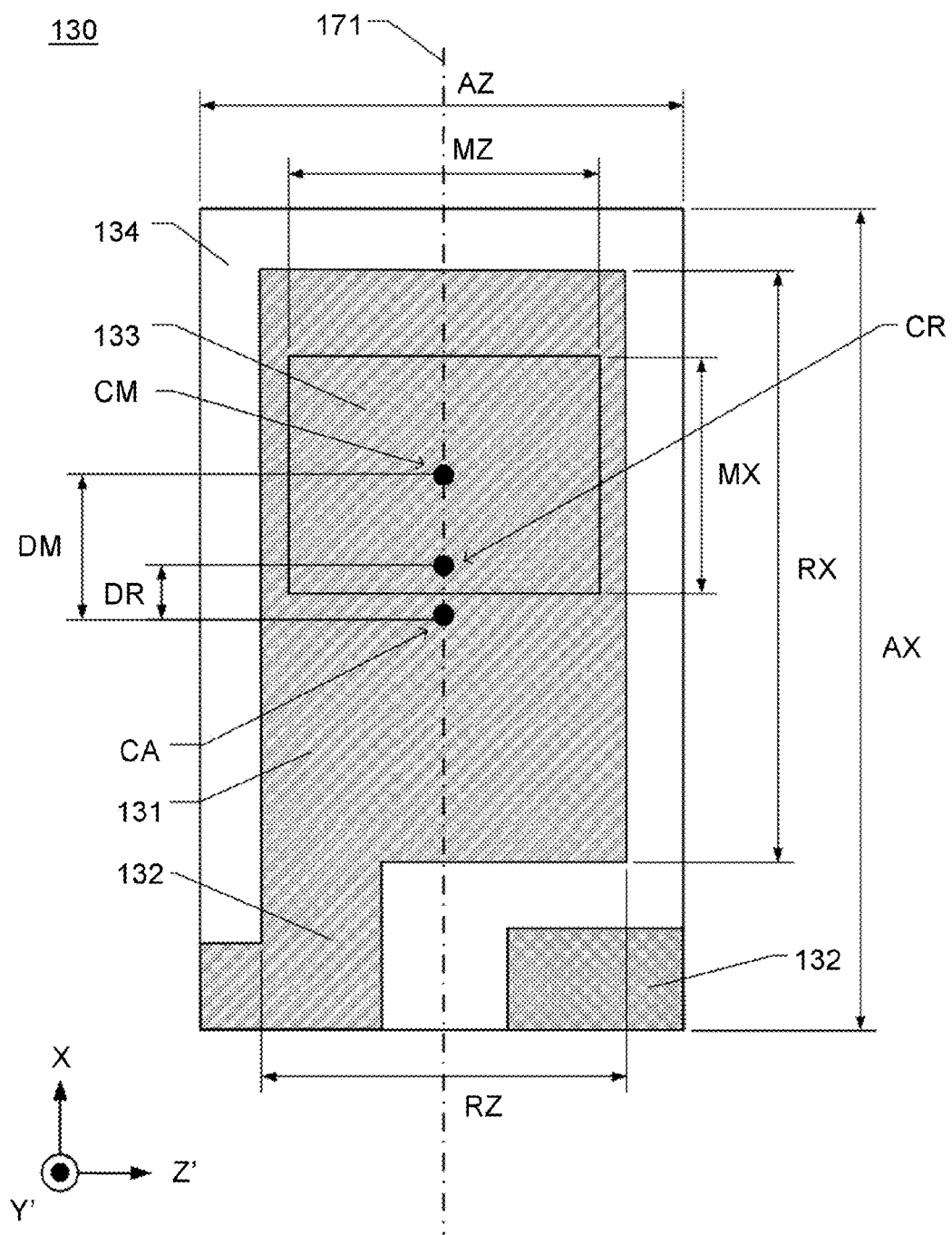
FIG. 3 is a plan view of a piezoelectric vibration element 130.

FIG. 3 is a plan view of the piezoelectric vibration element 130. The piezoelectric vibration element 130 includes the rectangular piezoelectric piece 134 that has a long side in the X-axis direction and the short side in the Z'-axis direction. The piezoelectric piece 134 includes the rectangular excitation electrodes 131 on the surfaces at the +Y'-axis side and the −Y'-axis side. The excitation electrodes 131, which are formed on the surfaces at the +Y'-axis side and the −Y'-axis side, mutually have the same shape and the same dimensions and symmetrically formed in the X-Z' plane. The piezoelectric piece 134 includes the mesa portions 133 on the surfaces at the +Y'-axis side and the −Y'-axis side. The surface of the mesa portion 133 is covered with the excitation electrode 131. The extraction electrode 132 is extracted from each excitation electrode 131 in the −X-axis direction.

Assume that a length of the piezoelectric piece in the X-axis direction (a length of the long side) is length AX, and a length of the piezoelectric piece in the Z'-axis direction (a length of the short side) is length AZ. Then, the piezoelectric vibration element 130 has the length AX of 1.355 mm and the length AZ of 0.795 mm. The following denotes a length of the excitation electrode in the X-axis direction as a length RX, a length of the excitation electrode in the Z'-axis direction as a length RZ, a length of the mesa portion in the X-axis direction as a length MX, and a length of the mesa portion in the Z'-axis direction as a length MZ. Further, the following will be assumed. The center of the surface at the +Y'-axis side of the piezoelectric piece 134 is a center CA. The center of the excitation electrode 131 formed on the surface at the +Y'-axis side is a center CR. The center of the mesa portion 133 formed at the +Y'-axis side is a center CM. A distance between the center CA and the center CR is a first distance DR. A distance between the center CA and the center CM is a second distance DM. Then, the first distance DR and the second distance DM described below are expressed as a negative value when the center CR and the center CM are closer to the −X-axis side than the center CA. The first distance DR and the second distance DM are expressed as a positive value when the center CR and the center CM are closer to the +X-axis side than the center CA. Further, the center CA, the center CR, and the center CM are on a straight line 171 parallel to the X-axis.

Simulation Result of the Piezoelectric Vibration Element 130

The appropriate formation position, shape, and size of the mesa portion 133 and the excitation electrode 131 of the piezoelectric vibration element 130 were examined by simulation. A description will be given of the simulation result.

Stress Applied to the Piezoelectric Vibration Element

Figure 4:
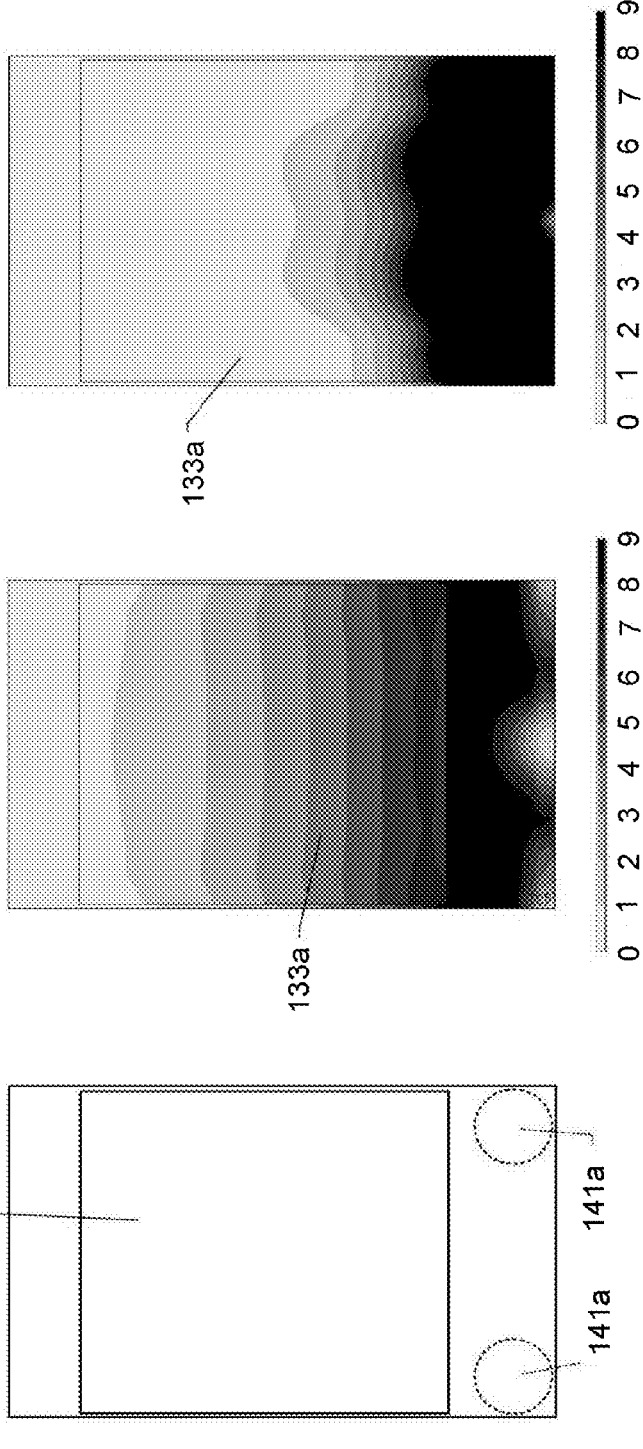

FIG. 4A is a plan view of a piezoelectric vibration element 130a. The piezoelectric vibration element 130a includes mesa portions 133a on the surfaces at the +Y'-axis side and the −Y'-axis side. Conductive adhesives 141a are formed on the surface at the −Y'-axis side of the piezoelectric vibration element 130a. The conductive adhesives 141a are formed at each corner portion of the −X-axis side and the +Z'-axis side, and the −X-axis side and the −Z'-axis side on the surface. The piezoelectric vibration element 130a was employed for a simulation of stress applied to a piezoelectric vibration element.

FIG. 4B is a plan view of the piezoelectric vibration element 130a where a simulation result of stress distribution at a drop of the piezoelectric device is illustrated. A simulation of dropping the piezoelectric device was performed assuming that acceleration of 3000 G was taken in the Y'-axis direction. FIG. 4B illustrates a strength of stress applied to the piezoelectric vibration element 130a by a drop in nine incremental values. The region indicated by a color close to white means that the weakest stress (0~1) is applied to the piezoelectric vibration element 130a. The black region means that the strongest stress (8~9) is applied to the piezoelectric vibration element 130a. It can be seen from FIG. 4B that stress applied to the periphery of the end portion at the +X-axis side of the piezoelectric vibration element 130a, which is the furthest from the formation position of the conductive adhesive 141a, is the smallest.

FIG. 4C is a plan view of the piezoelectric vibration element 130a where a simulation result of stress distribution at a temperature change of the piezoelectric device is illustrated. A simulation of changing temperature of the piezoelectric device was performed assuming that the temperature of the piezoelectric device was reduced from 400° C. to 25° C. FIG. 4C illustrates a strength of stress applied to the piezoelectric vibration element 130a by temperature change in nine incremental values. The region indicated by a color close to white means that the weakest stress (0~1) is applied to the piezoelectric vibration element 130a. The black region means that the strongest stress (8~9) is applied to the piezoelectric vibration element 130a. It can be seen from FIG. 4C that a change in stress affected by a temperature change becomes small as the region is away from the region where the conductive adhesive 141a is formed.

Stress generated in the piezoelectric vibration element may shift a vibration frequency of the piezoelectric vibration element. Further, the conductive adhesive may be deformed by stress once applied by a drop or similar cause. This leaves the vibration frequency of the piezoelectric vibration element shifted. It can be seen from FIGS. 4B and 4C that a position away from the position where the conductive adhesive is formed is less affected by stress generated by a drop and a temperature change. Accordingly, to prevent a vibration frequency from being shifted by stress caused by a drop, a temperature change, or similar cause, it is preferred that the mesa portion, which is the main region where a vibration frequency of the piezoelectric vibration element is generated, be disposed at a position away from the conductive adhesive.

Figure 5:
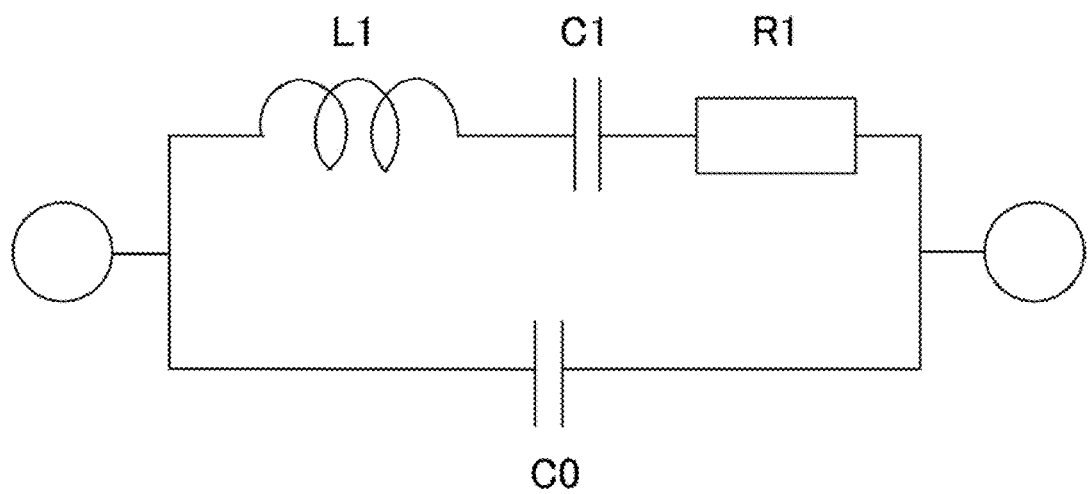
FIG. 5 is a circuit diagram illustrating an equivalent circuit of the piezoelectric vibration element.

Relationship Among Dimensions of the Mesa Portion and the Excitation Electrode and the Mesa Portion FIG. 5 is a circuit diagram illustrating an equivalent circuit of the piezoelectric vibration element. The piezoelectric vibration element can be expressed as an equivalent circuit as illustrated in FIG. 5. FIG. 5 indicates an equivalent series inductance as L1, an equivalent series capacitance as C1, an equivalent series resistance as R1, and a shunt capacitance as C0. R1 indicates a loss component, such as an internal friction and an acoustic loss of vibration energy during vibration. The R1 value corresponds to crystal impedance (CI) of the piezoelectric vibration element. Therefore, it is preferred that the R1 value be small. The C1 is a value that indicates flexibility and plasticity of the piezoelectric vibration element. The larger the C1 is, the stronger the plasticity of the piezoelectric vibration element is, and this condition is preferred. The following describes evaluation of C1s and R1s of the piezoelectric vibration element 130b and the piezoelectric vibration element 130c by simulation. This finds suitable relationship among dimensions of the mesa portion, the excitation electrode, and the mesa portion.

FIG. 6A is a plan view of the piezoelectric vibration element 130b. The piezoelectric vibration element 130b includes the mesa portion 133 on the surfaces at the +Y'-axis side and the −Y'-axis side. The excitation electrode 131 is formed to cover the mesa portion 133. The piezoelectric vibration element 130b has the length AX of 1.355 mm, the length AZ of 0.795 mm, the length RX of 0.89 mm, the length RZ of 0.64 mm, the length MZ of 0.6 mm, and the second distance DM of 0.045 mm. Conductive adhesives 141b are formed on the surface at the −Y'-axis side of the piezoelectric piece 134. The conductive adhesives 141b are formed at the −X-axis side and the +Z'-axis side, and the −X-axis side and the −Z'-axis side on the surface. The conductive adhesive 141b has a length SX in the X-axis direction of 0.215 mm and a length SZ in the Z'-axis direction of 0.22 mm.

FIG. 6B is a plan view of the piezoelectric vibration element 130c. The piezoelectric vibration element 130c includes the mesa portions 133 on the surfaces at the +Y'-axis side and the −Y'-axis side. An excitation electrode 131c is formed on the surface of the mesa portion 133. The conductive adhesives 141b are formed on the surface at the −Y'-axis side of the piezoelectric piece 134. The conductive adhesives 141b are formed at the −X-axis side and the +Z'-axis side, and the −X-axis side and the −Z'-axis side on the surface. The piezoelectric vibration element 130c has lengths AX, AZ, MZ, SX, SZ, and a second distance DM that are same values with the piezoelectric vibration element 130b. The length RZ of the excitation electrode 131c is formed to be 0.5 mm. The length RX is formed such that the length is equal to the value where 0.1 mm is subtracted from the length MX of the mesa portion 133. In short, the excitation electrode 131c includes an outer periphery of the excitation electrode 131c inside of the outer periphery side of the mesa portion 133 by 0.05 mm. The area of the excitation electrode 131c becomes narrower than an area of the excitation electrode 131.

Figure 7A:
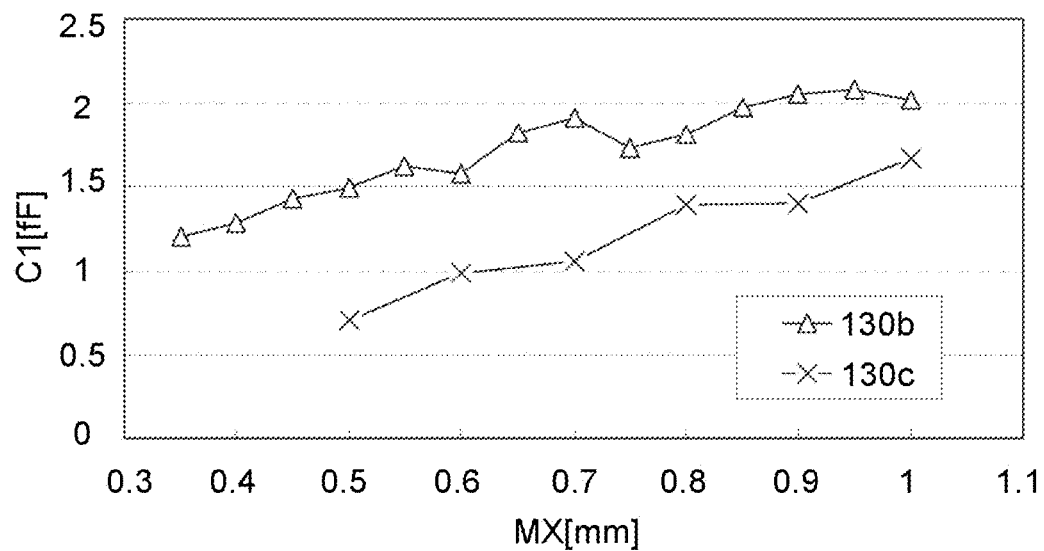
FIG. 7A is a graph illustrating a relationship between a length MX of a mesa portion in the X-axis direction and an equivalent series capacitance C1.

FIG. 7A is a graph illustrating a relationship between a length MX of the mesa portion 133 in the X-axis direction and the equivalent series capacitance C1. In FIG. 7A, the white triangle indicates the result of the piezoelectric vibration element 130b, and the cross mark indicates the result of the piezoelectric vibration element 130c. In FIG. 7A, the horizontal axis indicates the length MX of the mesa portion in the X-axis direction, and the vertical axis indicates the value of the equivalent series capacitance C1. In FIG. 7A, the piezoelectric vibration element 130b has C1 of approximately 1.2 fF when the length MX is 0.35 mm and C1 of approximately 2.0 fF when the length MX is 1 mm. The piezoelectric vibration element 130c has C1 of approximately 0.7 fF when the length MX is 0.5 mm and C1 of approximately 1.7 fF when the length MX is 1.0 mm. In FIG. 7A, C1 values of both the piezoelectric vibration element 130b and the piezoelectric vibration element 130c tend to be high as the length MX of the mesa portion 133 in the X-axis direction becomes long. That is, the larger the area of the mesa portion 133 is, the higher the C1 value is, and this condition is preferred. And, the C1 value of the piezoelectric vibration element 130*b* is always higher than the C1 value of the piezoelectric vibration element 130*c* in the length MX of the mesa portion 133 in the X-axis direction. The piezoelectric vibration element 130*b* differs from the piezoelectric vibration element 130*c* in the area of the excitation electrode. It is considered that the C1 value is higher, because the area of the excitation electrode 131 of the piezoelectric vibration element 130*b* is larger than the area of the excitation electrode 131*c* of the piezoelectric vibration element 130*c*. Therefore, it is considered that the area of the excitation electrode is preferred to be large.

Figure 7B:
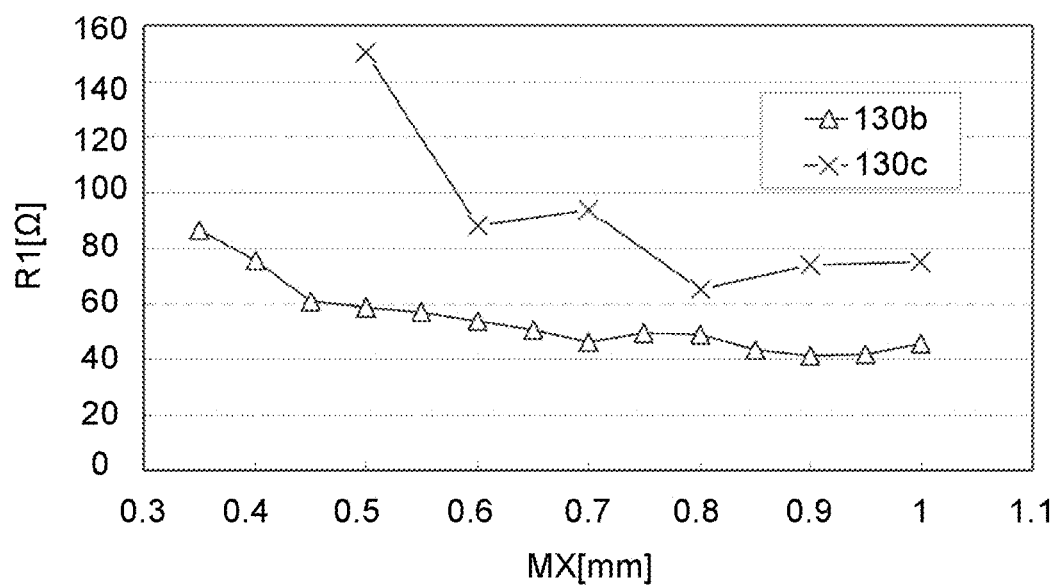
FIG. 7B is a graph illustrating a relationship between a length MX of a mesa portion in the X-axis direction and an equivalent series resistance R1.

FIG. 7B is a graph illustrating a relationship between a length MX of the mesa portion 133 in the X-axis direction and the equivalent series resistance R1. In FIG. 7B, the white triangle indicates the result of the piezoelectric vibration element 130*b*, and the cross mark indicates the result of the piezoelectric vibration element 130*c*. In FIG. 7B, the horizontal axis indicates the length MX of the mesa portion 133 in the X-axis direction, and the vertical axis indicates the value of the equivalent series resistance R1. In FIG. 7B, the piezoelectric vibration element 130*b* has R1 of approximately 87Ω when the length MX is 0.35 mm and R1 of approximately 46Ω when the length MX is 1.0 mm. The piezoelectric vibration element 130*c* has R1 of approximately 150Ω when the length MX is 0.5 mm and R1 of approximately 75Ω when the length MX is 1.0 mm. It can be seen from 7B that R1 values of both the piezoelectric vibration element 130*b* and the piezoelectric vibration element 130*c* become low as the length MX of the mesa portion 133 in the X-axis direction becomes long. That is, the larger the area of the mesa portion 133 is, the lower the R1 value is, and this condition is preferred. When the lengths MX of the mesa portion 133 in the X-axis direction are the same, the R1 value of the piezoelectric vibration element 130*b* is always lower than the R1 value of the piezoelectric vibration element 130*c*. It is considered that the R1 value is lower, because the area of the excitation electrode 131 of the piezoelectric vibration element 130*b* is larger than the area of the excitation electrode 131*c* of the piezoelectric vibration element 130*c*. Therefore, it is considered that the area of the excitation electrode is preferred to be large.

It can be seen from FIGS. 7A and 7B that the larger area of the mesa portion 133 is, the higher the C1 is, and the lower the R1 is, and this condition is preferred. Additionally, the larger the area of the excitation electrode is, the higher the C1 is, and the lower the R1 is, and this condition is preferred. With the piezoelectric vibration element 130, to form the large area of the excitation electrode, the center CR of the excitation electrode is close to the center CA of the piezoelectric piece 134. Considering that the extraction electrode 132 is to be formed on the side at the −X-axis side of the piezoelectric piece 134, it is preferred that the center CR of the excitation electrode 131 be formed at a position slightly toward the +X-axis side from the center CA of the piezoelectric piece 134. The mesa portion 133 is less stressed when it is disposed close to the +X-axis side of the piezoelectric piece 134, and this condition is preferred. Therefore, it is preferred that the center CM of the mesa portion 133 be disposed closer to the +X-axis side than the center CR of the excitation electrode 131 and the center CA of the piezoelectric piece 134.

Formation Position of the Mesa Portion

FIG. 8 is a table listing dimensions of the excitation electrode and dimensions of the mesa portion of the piezoelectric vibration element. The following describes a preferred position of the mesa portion relative to the piezoelectric vibration element by simulation of the piezoelectric vibration elements listed in FIG. 8. FIG. 8 lists four piezoelectric vibration elements: the piezoelectric vibration element 130*d*, a piezoelectric vibration element 130*e*, a piezoelectric vibration element 130*f*, and a piezoelectric vibration element 130*g*. The piezoelectric vibration element 130*d* and the piezoelectric vibration element 130*e* have the excitation electrodes and the mesa portions with the same dimensions. They differ only in the first distance DR, which is a distance between the center of the excitation electrode and the center of the piezoelectric vibration element. The piezoelectric vibration element 130*f* and the piezoelectric vibration element 130*g* differ only in the length MX of the mesa portion in the X-axis direction. Further, the piezoelectric vibration elements 130*d* and 130*e* mainly differ from the piezoelectric vibration elements 130*f* and 130*g* in a length RX of the excitation electrode in the X-axis direction.

Figure 9A:
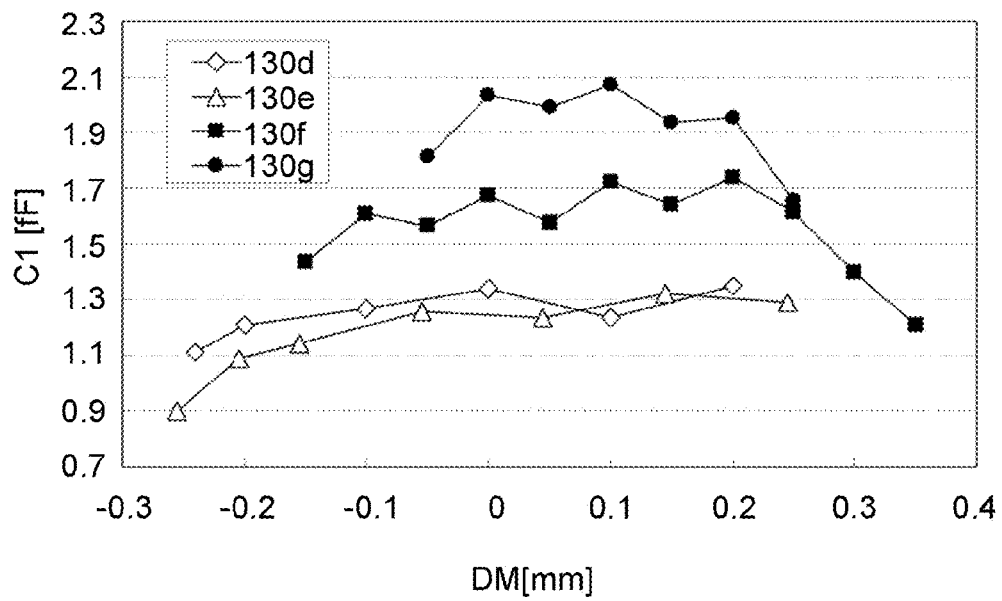
FIG. 9A is a graph illustrating a relationship between a second distance DM and the equivalent series capacitance C1.

FIG. 9A is a graph illustrating a relationship between the second distance DM and the equivalent series capacitance C1. In FIG. 9A, the horizontal axis indicates the second distance DM, and the vertical axis indicates the equivalent series capacitance C1. FIG. 9A also illustrates the relationship between the second distance DM and the equivalent series capacitance C1 of the four piezoelectric vibration elements listed in FIG. 8. In FIG. 9A, the white diamond indicates the piezoelectric vibration element 130*d*, the white triangle indicates the piezoelectric vibration element 130*e*, the black square indicates the piezoelectric vibration element 130*f*, and the black circle indicates the piezoelectric vibration element 130*g*.

It is a tendency that a C1 change relative to the second distance DM is similar between the piezoelectric vibration element 130*d* and the piezoelectric vibration element 130*e*. Additionally, it is a tendency that the C1 increases as the second distance DM increases until the second distance DM changes close to −0.1 mm. In the case where the second distance DM value is larger than −0.1 mm, the C1 is stable at a value close to approximately 1.3 fF, regardless of the second distance DM value. Therefore, the piezoelectric vibration element 130*d* and the piezoelectric vibration element 130*e* have a high C1 value when the second distance DM is larger than −0.1 mm, and this condition is preferred. Both the piezoelectric vibration element 130*d* and the piezoelectric vibration element 130*e* exhibit similar tendency; therefore, it is considered that the formation position of the excitation electrode 131 does not affect the C1 so much.

With the piezoelectric vibration element 130*f*, the C1 increases as the second distance DM increases until the second distance DM reaches −0.1 mm. When the second distance DM is between −0.1 mm and 0.2 mm, the C1 is stable between approximately 1.5 fF and approximately 1.7 fF. When the second distance DM is equal to or more than 0.2 mm, the C1 reduces as the second distance DM increases. Therefore, the piezoelectric vibration element 130*f* has a high C1 value when the second distance DM is between −0.1 mm and 0.2 mm, and this condition is preferred.

With the piezoelectric vibration element 130*g*, when the second distance DM is equal to or less than 0 mm, the C1 increases as the second distance DM increases. When the second distance DM is between 0 mm and 0.2 mm, the C1 is stable between approximately 1.9 fF and approximately 2.1 fF. When the second distance DM is equal to or more than 0.2 mm, the C1 reduces as the second distance DM increases. Therefore, the piezoelectric vibration element 130*g* has a high C1 value when the second distance DM is between 0 mm and 0.2 mm, and this condition is preferred.

FIG. 9A shows a tendency that the C1 value of the piezoelectric vibration element 130g is higher than the C1 value of the piezoelectric vibration element 130f. The piezoelectric vibration element 130f differs from the piezoelectric vibration element 130g in the area of the mesa portion 133; therefore, it is considered that the larger the area of the mesa portion 133 is, the higher the C1 value is. This is consistent with the fact that the C1 values of the piezoelectric vibration element 130d and the piezoelectric vibration element 130e, which have narrower areas of the mesa portion 133 than areas of the piezoelectric vibration element 130f and the piezoelectric vibration element 130g, are lower than the C1 values of the piezoelectric vibration element 130f and the piezoelectric vibration element 130g.

With the piezoelectric vibration element 130f and the piezoelectric vibration element 130g, the C1 becomes extremely low after the second distance DM value exceeds 0.2 mm. This is probably because if the mesa portion 133 is too close to the end portion of the piezoelectric vibration element, the mesa portion 133 does not serve well for a vibration. All the piezoelectric vibration elements 130d, 130e, 130f, and 130g have high C1 when the second distance DM is within the range of 0 mm to 0.2 mm. It is considered that the piezoelectric vibration element with the second distance DM within this range is preferable. As illustrated in FIGS. 4B and 4C, the vibrating region of the piezoelectric vibration element is preferably disposed at a position far from the conductive adhesive and close to the end of the +X-axis side since such position is less stressed. Therefore, the appropriate position of the center CM of the mesa portion 133 is a position where the second distance DM is within a range of 0 mm to 0.2 mm. The more preferred position is a position where the second distance DM is between 0.1 and 0.2 mm, in which the center CM of the mesa portion 133 is more close toward the +X-axis side. Considering a length ratio between the second distance DM and the length AX of the long side of the piezoelectric vibration element 130f, it is preferred that the second distance DM be within the range between 0.1 mm and 0.2 mm when the length AX is 1.355 mm. Therefore, it is preferred that the second distance DM be 0.073 to 0.148 times of the length AX.

Figure 9B:
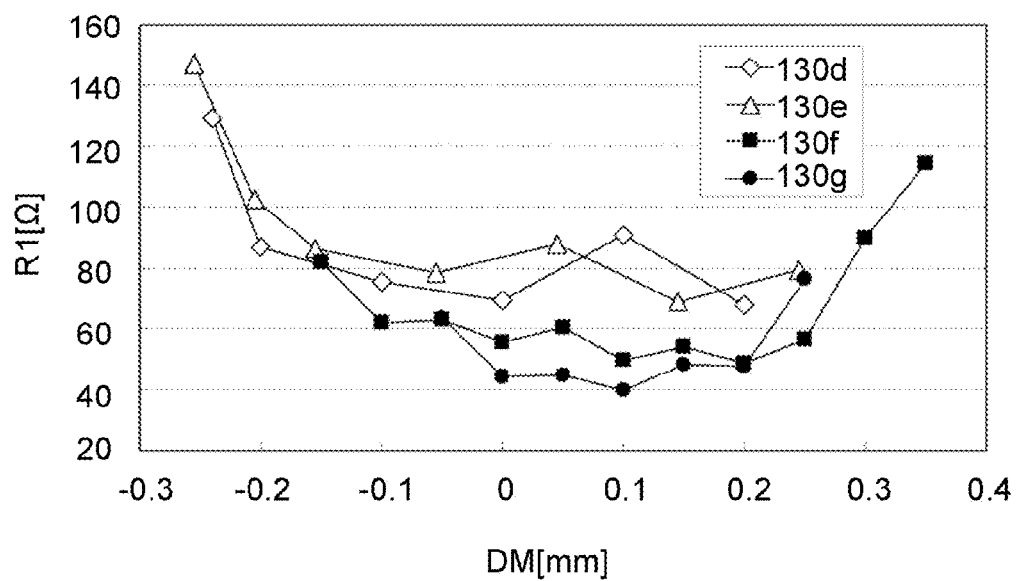
FIG. 9B is a graph illustrating a relationship between the second distance DM and the equivalent series resistance R1.

FIG. 9B is a graph illustrating a relationship between the second distance DM and the equivalent series resistance R1. FIG. 9B also illustrates the relationship between the equivalent series resistance R1 and the second distance DM of the four piezoelectric vibration elements listed in FIG. 8. In FIG. 9B, similarly to FIG. 9A, the white diamond indicates the piezoelectric vibration element 130d, the white triangle indicates the piezoelectric vibration element 130e, the black square indicates the piezoelectric vibration element 130f, and the black circle indicates the piezoelectric vibration element 130g. It is a similar tendency for both the piezoelectric vibration element 130d and the piezoelectric vibration element 130e: in the case where the second distance DM is larger than −0.2 mm, the R1 is stable at a low value close to approximately 80Ω, and this condition is preferred. With the piezoelectric vibration element 130f and the piezoelectric vibration element 130g, the R1 becomes low when the second distance DM is −0.1 mm to 0.25 mm and 0 mm to 0.2 mm, and this condition is preferred.

Similarity to FIG. 9A, a cause of respective different R1s among the piezoelectric vibration elements 130d, 130e, 130f, and 130g is associated with the area of the mesa portion 133. With the piezoelectric vibration element 130f, the R1 becomes large when the second distance DM exceeds 0.25 mm. With the piezoelectric vibration element 130g, the R1 becomes large when the second distance DM exceeds 0.2 mm. This is probably because if the mesa portion 133 is too close to the end portion of the piezoelectric vibration element, the mesa portion 133 does not serve well for a vibration. Similarly to FIG. 9A, all the piezoelectric vibration elements 130d, 130e, 130f, and 130g have low R1 when the second distance DM is from 0 mm to 0.2 mm. As illustrated in FIGS. 4B and 4C, the vibrating region of the piezoelectric vibration element is preferably disposed at a position far from the conductive adhesive and close to the end of the +X-axis side since such position is less stressed. Therefore, the appropriate position of the center CM of the mesa portion 133 is a position where the second distance DM is within a range of 0 mm to 0.2 mm. The more preferred position is a position where the second distance DM is between 0.1 and 0.2 mm, in which the center CM of the mesa portion 133 is more close toward the +X-axis side. Similarly to FIG. 9A, it is preferred that the second distance DM be 0.073 to 0.148 times of the length AX.

Second Embodiment

A piezoelectric vibration element may include a framing portion that surrounds a piezoelectric piece. A description will be given of a piezoelectric vibration element 230 with the framing portion and a piezoelectric device 200 with the piezoelectric vibration element 230. Like reference numerals designate corresponding or identical elements throughout Embodiments 1 and 2, and therefore such elements will not be further elaborated here.

Constitution of the Piezoelectric Device 200

Figure 10:
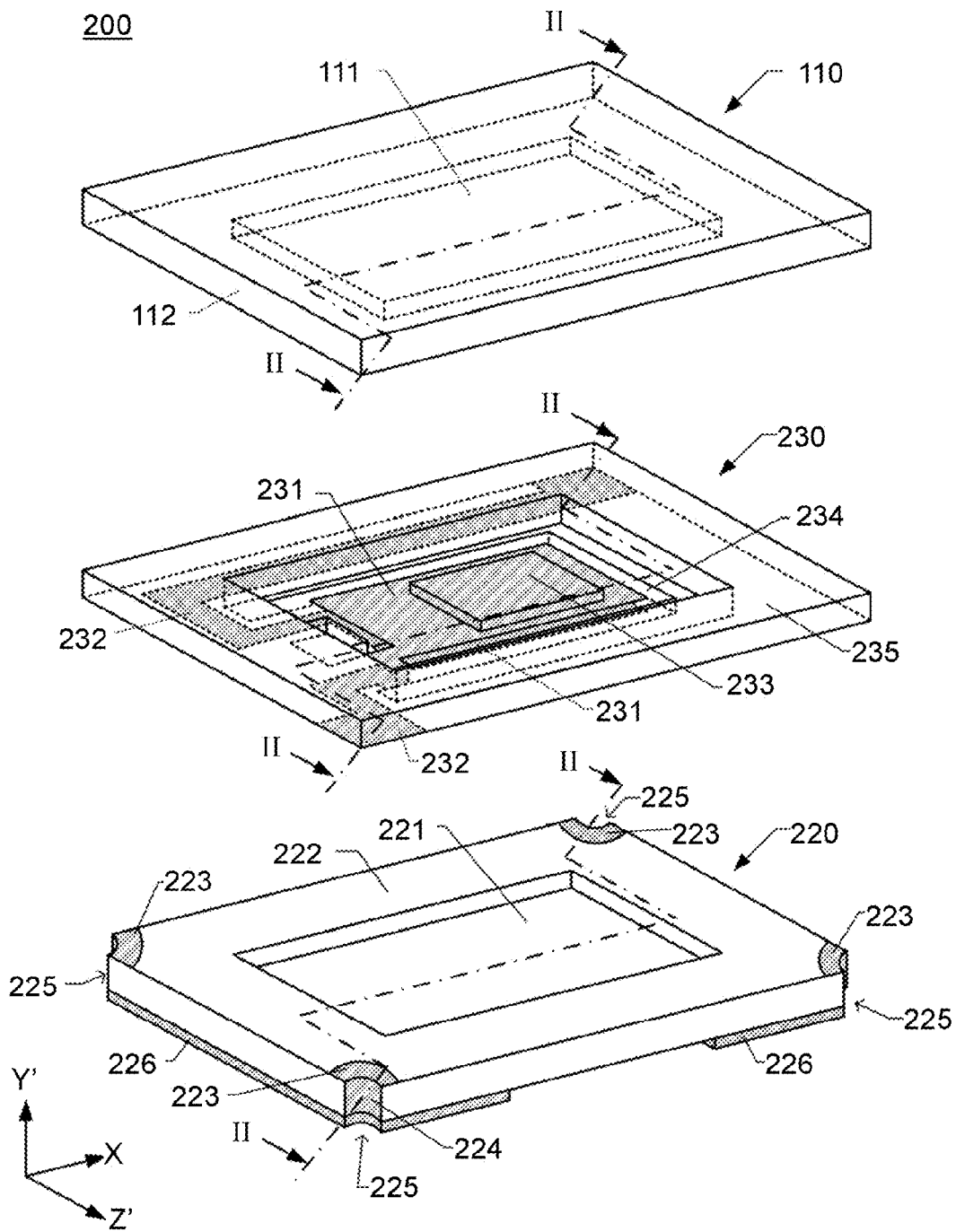
FIG. 10 is an exploded perspective view of a piezoelectric device 200.

FIG. 10 is an exploded perspective view of the piezoelectric device 200. The piezoelectric device 200 includes a piezoelectric vibration element 230, a base plate 220, and a lid plate 110. The piezoelectric vibration element 230 includes a piezoelectric piece 234 and a framing portion 235, which surrounds the piezoelectric piece 234. The base plate 220 and the lid plate 110 are bonded together with sandwiching the framing portion 235, thus the piezoelectric device 200 is formed.

The piezoelectric vibration element 230 is formed of the piezoelectric piece 234 and the framing portion 235. The piezoelectric piece 234 connects to the framing portion 235 at the −X-axis side. The piezoelectric piece 234 includes a mesa portion 233. Excitation electrodes 231 are formed at the mesa portion 233 and the peripheral area of the mesa portion 233. An extraction electrode 232 is extracted from the excitation electrode 231 to the framing portion 235.

A bonding surface 222 is formed at the peripheral area on the surface at the +Y'-axis side of the base plate 220. The bonding surface 222 is to be bonded to the framing portion 235 via a sealing material 141 (see FIG. 11). The base plate 220 includes a depressed portion 221 at the center of the surface at the +Y'-axis side. The depressed portion 221 is depressed from the bonding surface 222 in the −Y'-axis direction. The base plate 220 includes connecting electrodes 223 at four corners on the bonding surface 222. An extraction electrode 232 of the piezoelectric vibration element 230 electrically connects to the connecting electrode 223. The base plate 220 includes castellations 225 at four corners on the side surfaces. The castellation 225 is depressed toward inside of the base plate 220. Each castellation 225 includes a side surface electrode 224 on its side surface. A pair of external electrodes 226 is disposed on the surface at the −Y'-axis side of the base plate 220. The external electrode 226 electrically connects to the connecting electrode 223 via the side surface electrode 224.

Figure 11:
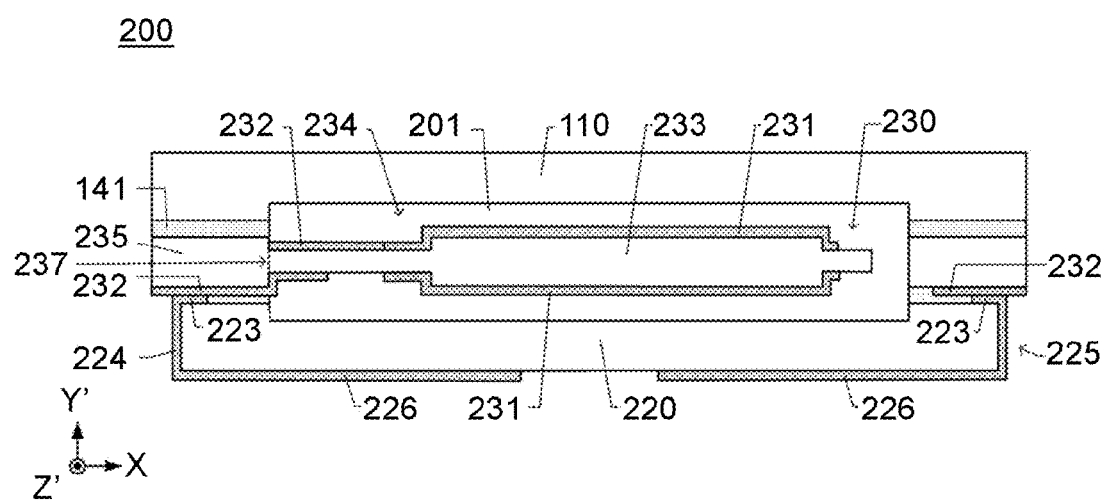
FIG. 11 is a cross-sectional view taken along the line II-II of FIG. 10.

FIG. 11 is a cross-sectional view taken along the line II-II of FIG. 10. With the piezoelectric device 200, the lid plate 110 is bonded on the surface at the +Y'-axis side of the framing portion 235 of the piezoelectric vibration element 230 via the sealing material 141. The base plate 220 is bonded on the surface at the −Y'-axis side of the framing portion 235 via the sealing material 141. This forms a cavity 201 in the piezoelectric device 200, and the piezoelectric piece 234 of the piezoelectric vibration element 230 is sealed in the cavity 201.

The piezoelectric vibration element 230 includes the mesa portions 233 on the surfaces at the +Y'-axis side and the −Y'-axis side. The excitation electrode 231 is formed to cover the mesa portion 233. The extraction electrode 232 is extracted from the excitation electrode 231 to the surface at the −Y'-axis side of the framing portion 235. The extraction electrode 232 electrically connects to the connecting electrode 223 of the base plate 220. Since the connecting electrode 223 electrically connects to the external electrode 226 via the side surface electrode 224, the excitation electrode 231 electrically connects to the external electrode 226.

Figure 12:
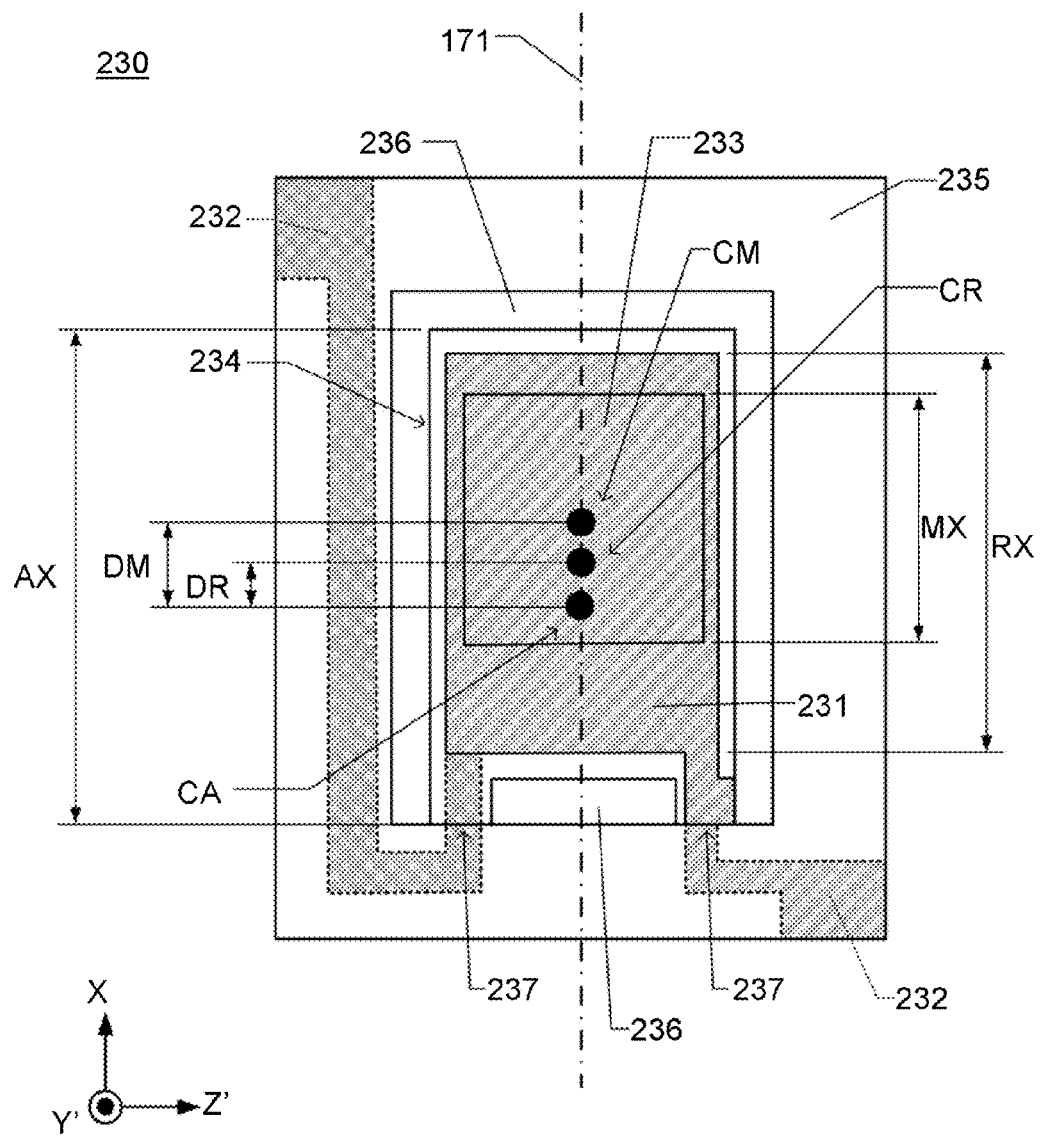
FIG. 12 is a plan view of a piezoelectric vibration element 230.

FIG. 12 is a plan view of the piezoelectric vibration element 230. The piezoelectric vibration element 230 includes the piezoelectric piece 234 and the framing portion 235. The piezoelectric piece 234 connects to the framing portion 235 at the side of the −X-axis side. Between the piezoelectric piece 234 and the framing portion 235, through grooves 236 are formed. The through grooves 236 penetrate the piezoelectric vibration element 230 in the Y'-axis direction. The through grooves 236 are formed at the center of the −X-axis side, at the +X-axis side, at the +Z'-axis side, and at the −Z'-axis side of the piezoelectric piece 234. Therefore, the piezoelectric piece 234 connects to the framing portion 235 at two portions: at the end portions on the side of the −X-axis side at the +Z'-axis side, and at the −Z'-axis side of the piezoelectric piece 234. The two portions, where this piezoelectric piece 234 connects to the framing portion 235, are referred to as connecting portions 237.

The piezoelectric piece 234 of the piezoelectric vibration element 230 includes the mesa portions 233 on the surfaces at the +Y'-axis side and the −Y'-axis side. The excitation electrode 231 is formed in the piezoelectric piece 234 to cover the mesa portion 233. From the excitation electrode 231 formed on the surface at the +Y'-axis side of the piezoelectric piece 234, the extraction electrode 232 is extracted to the corner of the −X-axis side and the +Z'-axis side of the framing portion 235 via the side surface at the +Z'-axis side and the connecting portion 237 at the +Z'-axis side of the piezoelectric piece 234. From the excitation electrode 231 formed on the surface at the −Y'-axis side, the extraction electrode 232 is extracted to the corner of the +X-axis side and the −Z'-axis side of the framing portion 235 via the connecting portion 237 at the −Z'-axis side.

Simulation Result of the Piezoelectric Vibration Element 230a

The appropriate formation position, shape, and size of the mesa portion 233 of the piezoelectric vibration element 230 were examined by simulation. A description will be given of the simulation result.

Stress and Temperature Dependence

Figure 13C:
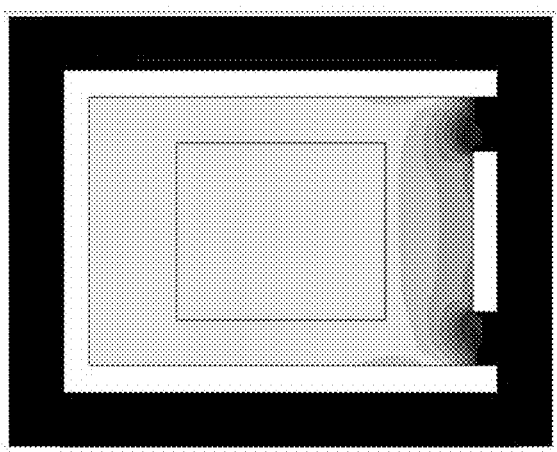
FIG. 13C is a plan view of the piezoelectric vibration element 230a where a simulation result of stress distribution at a temperature change of the piezoelectric device is illustrated.
Figure 13B:
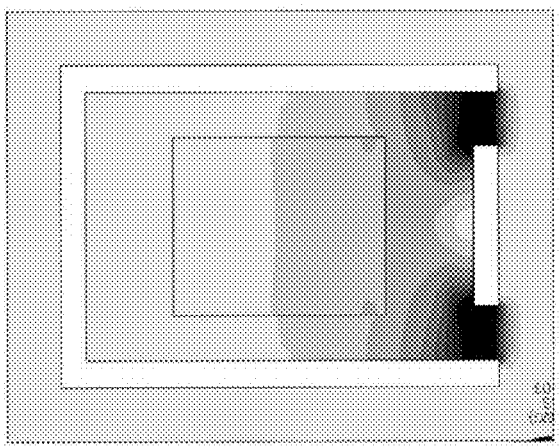
FIG. 13B is a plan view of the piezoelectric vibration element 230a where a simulation result of stress distribution at a drop of the piezoelectric device is illustrated.
Figure 13A:
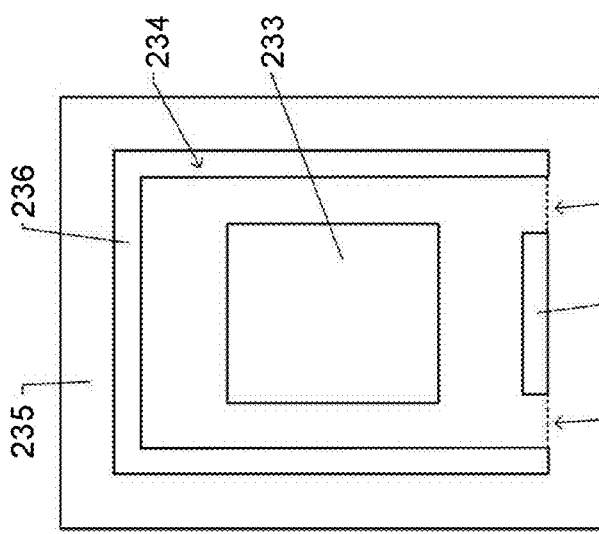

FIG. 13A is a plan view of the piezoelectric vibration element 230a. The piezoelectric vibration element 230a was employed for the simulation. The piezoelectric vibration element 230a includes the mesa portion 233 on the surfaces at the +Y'-axis side and the −Y'-axis side. The piezoelectric piece 234 connects to the framing portion 235 via the connecting portions 237 at the end portion at the side of the −X-axis side at the +Z'-axis side and the −Z'-axis side of the piezoelectric vibration element 230a.

FIG. 13B is a plan view of the piezoelectric vibration element 230a where a simulation result of stress distribution at a drop of the piezoelectric device is illustrated. A simulation of dropping the piezoelectric device was performed assuming that acceleration of 3000G was taken in the Y'-axis direction. FIG. 13B illustrates a strength of stress applied to the piezoelectric vibration element 230a by a drop in nine incremental values. The region indicated by a color close to white means that the weakest stress (0~1) is applied to the piezoelectric vibration element 230a. The black region means that the strongest stress (8~9) is applied to the piezoelectric vibration element 230a. It can be seen from FIG. 13B that stress applied in the piezoelectric piece 234 becomes small at the +X-axis side of the piezoelectric piece 234. Therefore, it is preferred that the mesa portion 233 where a vibration is generated be formed at the +X-axis side of the piezoelectric piece 234.

FIG. 13C is a plan view of the piezoelectric vibration element 230a where a simulation result of stress distribution at a temperature change of the piezoelectric device is illustrated. A simulation of changing temperature of the piezoelectric device was performed assuming that the temperature of the piezoelectric device was reduced from 400° C. to 25° C. FIG. 13C illustrates a strength of stress applied to the piezoelectric vibration element 230a by temperature change in nine incremental values. The region indicated by a color close to white means that the weakest stress (0~1) is applied to the piezoelectric vibration element 230a. The black region means that the strongest stress (8~9) is applied to the piezoelectric vibration element 230a. FIG. 13C illustrates regions close to the connecting portions 237 of the framing portion 235 and the piezoelectric piece 234 in black. This shows that strong stress is applied to these regions. The farther a distance between the piezoelectric piece 234 and the connecting portion 237 is, the smaller the stress is. Hence, it is assumed that a change in stress affected by a temperature change becomes the smallest at a periphery of the end portion at the +X-axis side of the piezoelectric piece 234.

In FIGS. 13B and 13C, stress becomes the smallest at a region farthest from the connecting portions 237. Accordingly, with the piezoelectric vibration element, the closer the mesa portion 233 is to the +X-axis side, the less a frequency variation caused by stress is. The −X-axis side of the piezoelectric piece 134 is secured with the conductive adhesive. Similarly, the piezoelectric piece 234 is secured to the framing portion 235 at the side at the −X-axis side via the connecting portion 237. Similarly to Embodiment 1, it is considered to be preferable that the second distance DM be 0.073 to 0.148 times of the length AX.

Representative embodiments are described in detail above; however, as will be evident to those skilled in the relevant art, this disclosure may be changed or modified in various ways within its technical scope.

For example, the first Embodiment and the second Embodiment disclose the mesa portions disposed on the both principal surfaces at the +Y'-axis side and the −Y'-axis side; however, the mesa portion may be formed on only either one of the principal surfaces. Additionally, the above-described embodiments disclose a case where the piezoelectric piece is an AT-cut crystal wafer. A BT-cut crystal wafer or similar member that similarly vibrates in the thickness-shear mode is similarly applicable. Further, the piezoelectric piece is basically applicable to a piezoelectric material that includes not only quartz-crystal material but also lithium tantalite, lithium niobate, and piezoelectric ceramic.

In the piezoelectric vibration element according to the first aspect, a second aspect may be constituted as follows. The second distance may be 0.073 to 0.148 times of a length of the long side.

In the piezoelectric vibration element according to the first aspect and the second aspect, a third aspect may further include a framing portion that surrounds the piezoelectric piece. The framing portion connects to the one short side of the piezoelectric piece. The pair of extraction electrodes is further extracted from the one short side to the framing portion.

A fourth aspect is a piezoelectric device that includes the piezoelectric vibration element according to the first aspect to the third aspect, a base plate where the piezoelectric vibration element is placed, and a lid plate that seals the piezoelectric piece.

With the piezoelectric vibration element and the piezoelectric device according to the embodiments, a frequency variation caused by impact such as a drop and temperature change can be less generated. This ensures the improved vibration characteristic.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibration element, comprising:
a piezoelectric piece that has a rectangular shape with long sides and short sides, the piezoelectric piece including a first principal surface and a second principal surface, the second principal surface being a backside surface of the first principal surface, the piezoelectric piece including a mesa portion at least on the first principal surface, the mesa portion being thicker than a peripheral portion;
a pair of excitation electrodes, formed on the first principal surface and the second principal surface; and
a pair of extraction electrodes, extracted from the pair of excitation electrodes to one of the short sides, wherein
the excitation electrode is larger than an area of the mesa portion and covers the mesa portion on the principal surface where the mesa portion is formed,
the excitation electrode has a center away from a center of the piezoelectric piece toward a first short side of the short sides by a first distance, and
the mesa portion has a center away from the center of the piezoelectric piece toward the first short side by a second distance, and
the second distance is different from the first distance,
wherein the center of the excitation electrode, the center of the piezoelectric piece and the center of the mesa portion are positioned on a straight line passing through centers of the short sides,
wherein the mesa portion has a quadrilateral shape; and the pair of excitation electrodes has a quadrilateral shape.

2. The piezoelectric vibration element according to claim 1, wherein the second distance is 0.073 to 0.148 times of a length of the long side.

3. The piezoelectric vibration element according to claim 1, further comprising:
a framing portion that surrounds the piezoelectric piece, the framing portion being connected to the one short side of the piezoelectric piece; and
the pair of extraction electrodes that is further extracted from the one short side to the framing portion.

4. A piezoelectric device, comprising:
the piezoelectric vibration element according to claim 1;
a base plate where the piezoelectric vibration element is placed; and
a lid plate that seals the piezoelectric piece.

5. The piezoelectric vibration element according to claim 1, wherein
the pair of excitation electrodes are defined as electrodes that are disposed in a region in which the electrodes are disposed oppositely with each other in an up-down direction of the piezoelectric piece.

6. A piezoelectric vibration element, comprising:
a piezoelectric piece that has a rectangular shape with long sides and short sides, the piezoelectric piece including a first principal surface and a second principal surface, the second principal surface being a backside surface of the first principal surface, the piezoelectric piece including a mesa portion at least on the first principal surface, the mesa portion being thicker than a peripheral portion;
a pair of excitation electrodes, formed on the first principal surface and the second principal surface; and
a pair of extraction electrodes, extracted from the pair of excitation electrodes to one of the short sides, wherein
the excitation electrode is larger than an area of the mesa portion and covers the mesa portion on the principal surface where the mesa portion is formed,
the excitation electrode has a center away from a center of the piezoelectric piece toward a first short side of the short sides by a first distance, and
the mesa portion has a center away from the center of the piezoelectric piece toward the first short side by a second distance, and
the second distance is different from the first distance,
wherein the second distance is 0.073 to 0.148 times of a length of the long side.

7. A piezoelectric vibration element, comprising:
a piezoelectric piece that has a rectangular shape with long sides and short sides, the piezoelectric piece including a first principal surface and a second principal surface, the second principal surface being a backside surface of the first principal surface, the piezoelectric piece including a mesa portion at least on the first principal surface, the mesa portion being thicker than a peripheral portion;
a pair of excitation electrodes, formed on the first principal surface and the second principal surface; and
a pair of extraction electrodes, extracted from the pair of excitation electrodes to one of the short sides, wherein
the excitation electrode is larger than an area of the mesa portion and covers the mesa portion on the principal surface where the mesa portion is formed,
the excitation electrode has a center away from a center of the piezoelectric piece toward a first short side of the short sides by a first distance, and
the mesa portion has a center away from the center of the piezoelectric piece toward the first short side by a second distance, and
the second distance is different from the first distance,
wherein the pair of excitation electrodes are defined as electrodes that are disposed in a region in which the electrodes are disposed oppositely with each other in an up-down direction of the piezoelectric piece,
wherein the mesa portion has a quadrilateral shape; and the pair of excitation electrodes has a quadrilateral shape.

* * * * *